(12) United States Patent
Minematsu et al.

(10) Patent No.: US 9,586,349 B2
(45) Date of Patent: Mar. 7, 2017

(54) METHOD FOR MANUFACTURING DETECTING SENSOR, DETECTING SENSOR, AND TRANSMISSION

(71) Applicants: Tyco Electronics Japan, G.K., Kanagawa-ken (JP); Honda Motor Co., Ltd., Tokyo (JP)

(72) Inventors: Takayuki Minematsu, Kanagawa (JP); Takanori Nakai, Kanagawa (JP); Nobutaka Fukamizu, Tochigi (JP); Kyoji Kitajima, Tochigi (JP)

(73) Assignees: Tyco Electronics Japan G.K., Kanagawa-ken (JP); Honda Motor Co., Ltd., Tokyo (JP)

( * ) Notice: Subject to any disclaimer, the term of this patent is extended or adjusted under 35 U.S.C. 154(b) by 273 days.

(21) Appl. No.: 14/262,397

(22) Filed: Apr. 25, 2014

(65) Prior Publication Data
US 2014/0232039 A1    Aug. 21, 2014

Related U.S. Application Data

(63) Continuation of application No. PCT/JP2012/005561, filed on Sep. 3, 2012.

(30) Foreign Application Priority Data

Oct. 27, 2011   (JP) .................................. 2011-235986

(51) Int. Cl.
*G01R 33/00* (2006.01)
*F16H 59/10* (2006.01)
(Continued)

(52) U.S. Cl.
CPC .. *B29C 45/14065* (2013.01); *B29C 45/14639* (2013.01); *F16H 59/105* (2013.01);
(Continued)

(58) Field of Classification Search
CPC .. G01R 33/0047; G01R 33/0052; F16H 59/10
See application file for complete search history.

(56) References Cited

U.S. PATENT DOCUMENTS

2007/0075705 A1    4/2007   Kurumado
2008/0012555 A1    1/2008   Ikeda
(Continued)

FOREIGN PATENT DOCUMENTS

DE    102006008478 A1    9/2007
JP           8-49575    2/1996
(Continued)

OTHER PUBLICATIONS

European Search Report, App. No. 12843767.0, dated Sep. 11, 2015, 10 pages.
(Continued)

*Primary Examiner* — Terence Boes
(74) *Attorney, Agent, or Firm* — Barley Snyder

(57) ABSTRACT

A detecting sensor is disclosed having a magnet, a plurality of magnetic field detecting sensor elements, and a housing. The magnetic field detecting sensor elements have a plurality of adjacent, overlapped bodies and a plurality of terminals projecting from the bodies in a same direction. The housing is disposed over the magnet and plurality of sensor elements, and has first and second sensor holding members. The first sensor holding member is positioned on a first side of the housing and abutted against a surface of the body on a first side of the plurality of sensor elements. The second sensor holding member is positioned on a second side of the housing and abutted across a portion of a surface of the body of the sensor element on a second side of the plurality of sensor elements.

1 Claim, 14 Drawing Sheets

(51) Int. Cl.
  *B29C 45/14*   (2006.01)
  *G01D 5/14*   (2006.01)
  *F16H 59/70*   (2006.01)
  *G01D 11/24*   (2006.01)
  *B29L 31/34*   (2006.01)

(52) U.S. Cl.
  CPC ............ *F16H 59/70* (2013.01); *G01D 5/142* (2013.01); *G01D 5/147* (2013.01); *G01D 11/245* (2013.01); *G01R 33/0047* (2013.01); *G01R 33/0052* (2013.01); *B29C 2045/14131* (2013.01); *B29K 2995/0007* (2013.01); *B29K 2995/0008* (2013.01); *B29L 2031/3481* (2013.01); *Y10T 74/2014* (2015.01)

(56) References Cited

U.S. PATENT DOCUMENTS

2008/0106873 A1   5/2008   Okuya
2008/0237818 A1   10/2008  Engel et al.
2015/0177336 A1*  6/2015   Park .................. G01D 5/145
                                                          73/115.02

FOREIGN PATENT DOCUMENTS

| JP | 2001-116815 | 4/2001 |
| JP | 2002-181909 | 6/2002 |
| JP | 3491587 | 11/2003 |
| JP | 2009-27100 | 11/2009 |
| JP | 2011-86479 | 4/2011 |
| WO | 2009015990 A2 | 2/2009 |

OTHER PUBLICATIONS

International Search Report issued in co-peinding PCT Application—PCT/JP2012/005561, Oct. 9, 2012, 4 pages.

* cited by examiner

METHOD FOR MANUFACTURING DETECTING SENSOR, DETECTING SENSOR, AND TRANSMISSION

CROSS-REFERENCE TO RELATED APPLICATIONS

This application is a continuation of PCT International Application No. PCT/JP2012/005561, filed Sep. 3, 2012, which claims priority under 35 U.S.C. §119 to Japanese Patent Application No. 2011-235986, filed Oct. 27, 2011.

FIELD OF THE INVENTION

The present invention is generally related to detecting sensors, and more specifically related magnetic field detecting sensors used in automobiles.

BACKGROUND

It is well known that electronic control is becoming commonplace in automobiles, and detecting sensors for detecting the operation of various parts are quite often used. Generally these detecting sensors monitor whether or not the parts are at predetermined positions by using magnetism.

Specifically, multiplexed detecting sensors are responsible for detecting the operation of an important part, such as a part involved in controlling a running automobile. (see JP8-49575A and JP3-491587B). In a multiplexed detecting sensor, a plurality of sensor elements are present, allowing redundancy in the event a malfunction occurs in one of the sensor elements. When one sensor element malfunctions, detection can be performed by using the other sensor element, or detection results of one and the other of the sensor elements are compared to perform failure diagnosis of the sensor elements.

FIG. 14 shows an existing detecting sensor 1 manufactured by the present applicants. The detecting sensor 1 has a magnet 3 with a substantially U shape member and two sensor elements 4A and 4B are held in an housing (not shown). A recess 3a opens on one side of the magnet 3. In the magnet 3, a region A with no magnetic flux exists inside the recess 3a. The two sensor elements 4A and 4B are positioned in the region A with no magnetic flux.

When the detecting sensor 1 is mass-produced, it is important to maintain high location accuracy for the magnet 3 and the sensor elements 4A and 4B. This is because any variations in the positions of the sensor elements 4A and 4B with respect to the magnet 3, directly affect product accuracy when using a plurality of detecting sensors 1.

To address this problem, the magnet 3 and the sensor elements 4A and 4B are fixed to the housing (not shown) of the detecting sensor 1 with high accuracy. However, the sensor elements 4A and 4B are positioned in the housing (not shown) through body members 4e, where an element body and first end of a terminal are embedded.

The disadvantage of this approach is that the body members 4e are molded from insulating resin, and thus do not have high molding accuracy. Therefore, there is a limit to improve the location accuracy of the magnet 3 and the sensor elements 4A and 4B by fixing the sensor elements 4A and 4B to the housing through the body members 4e.

Location accuracy can be improved by increasing the molding accuracy of the bodies 4e of the sensor elements 4A and 4B; however, such an approach is prohibitively expensive. A need exists for an design that uses an alternative manufacturing method that increases the location accuracy of the magnet 3 and sensor elements 4A and 4B at a low cost.

Further, a disadvantage of the conventional detecting sensor occurs when the object to be detected is a rotating body. When the conventional detecting sensor detects a rotating operation of the object, the magnetic field generated by the magnet is strained by the influence of rotation of the object to be detected, and detection accuracy is affected.

SUMMARY

It is therefore an object of the invention to provide a detecting sensor having a magnet, a plurality of magnetic field detecting sensor elements, and a housing. The magnetic field detecting sensor elements have a plurality of adjacent, overlapped bodies and a plurality of terminals projecting from the bodies in a same direction. The housing is disposed over the magnet and plurality of sensor elements, and has first and second sensor holding members. The first sensor holding member is positioned on a first side of the housing and abutted against a surface of the body on a first side of the plurality of sensor elements. The second sensor holding member is positioned on a second side of the housing and abutted across a portion of a surface of the body of the sensor element on a second side of the plurality of sensor elements.

BRIEF DESCRIPTION OF THE DRAWINGS

The invention will now be described by way of example with reference to the accompanying figures, of which.

DETAILED DESCRIPTION OF THE EMBODIMENT(S)

In the following, the present invention is described in detail based on an embodiment shown in the accompanying drawings.

FIGS. 1 to 11 are views for describing the configuration of a detecting sensor 10 in the present embodiment. In the following embodiments, the detecting sensor 10 is used for detecting whether or not a part constituting an automobile is at a particular position. In an exemplary embodiment, the detecting sensor 10 is used for detecting whether a manual transmission of an automobile is positioned in a neutral state.

Figure 1:
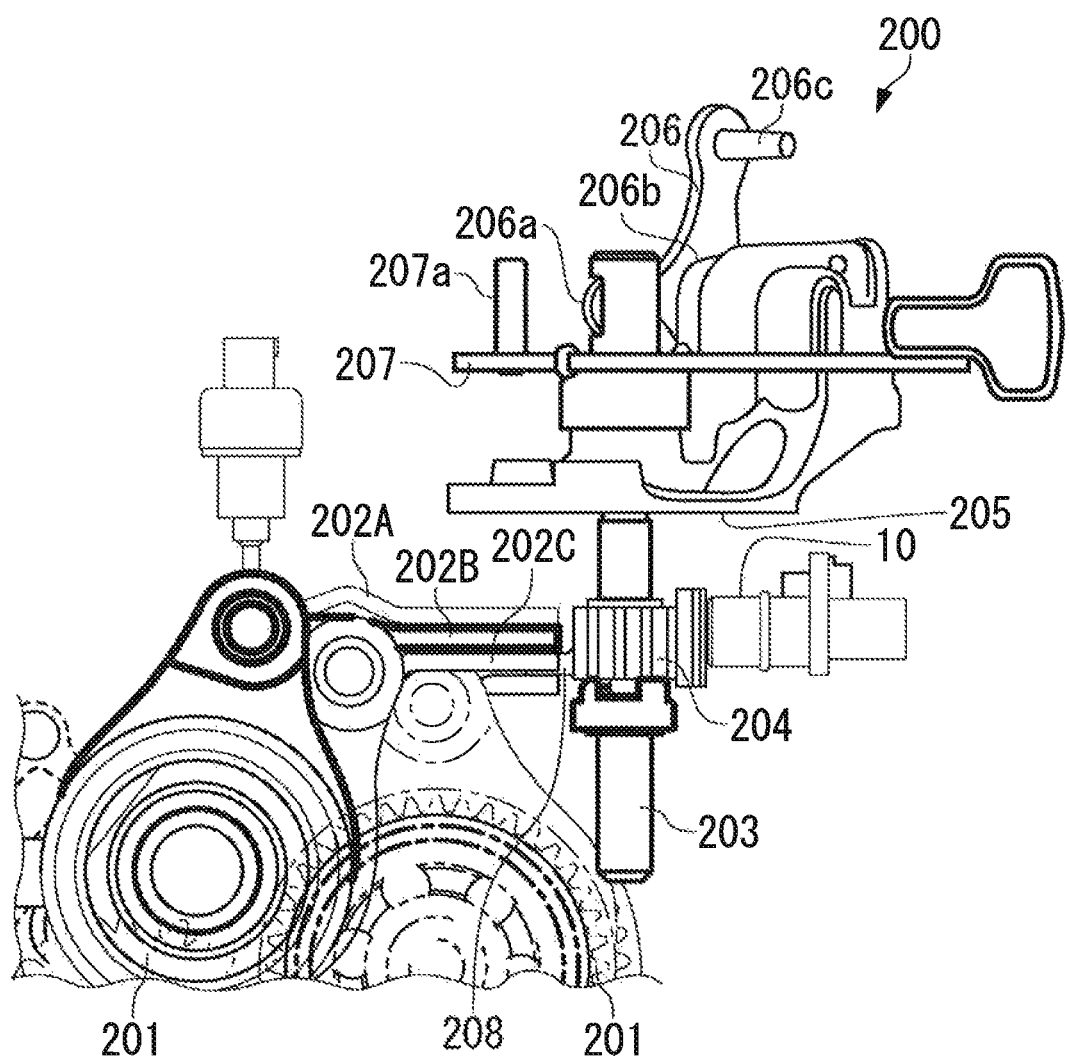
FIG. 1 is a perspective view of an embodiment of an automobile transmission.
Figure 2:
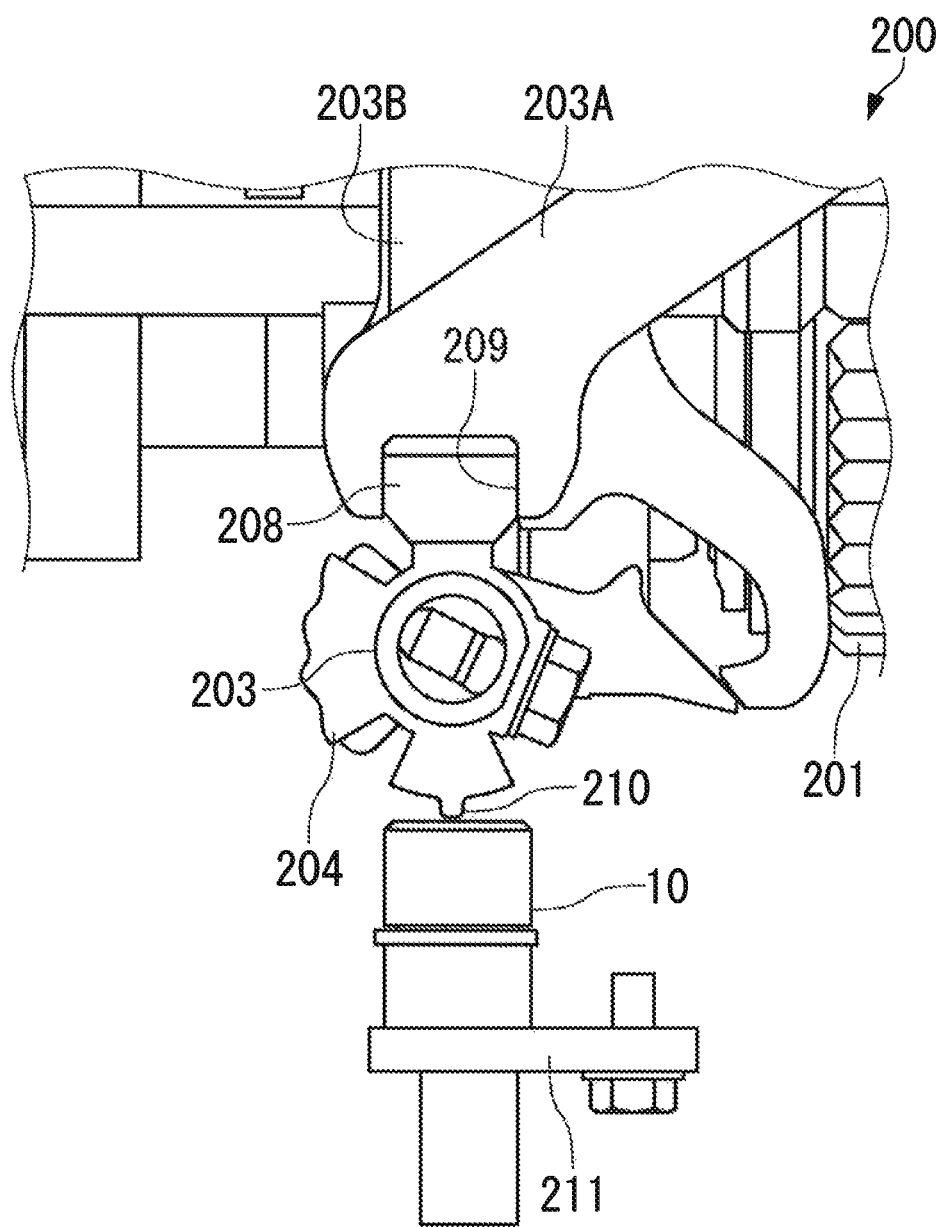
FIG. 2 is a plan view of a portion in FIG. 1.
Figure 3:
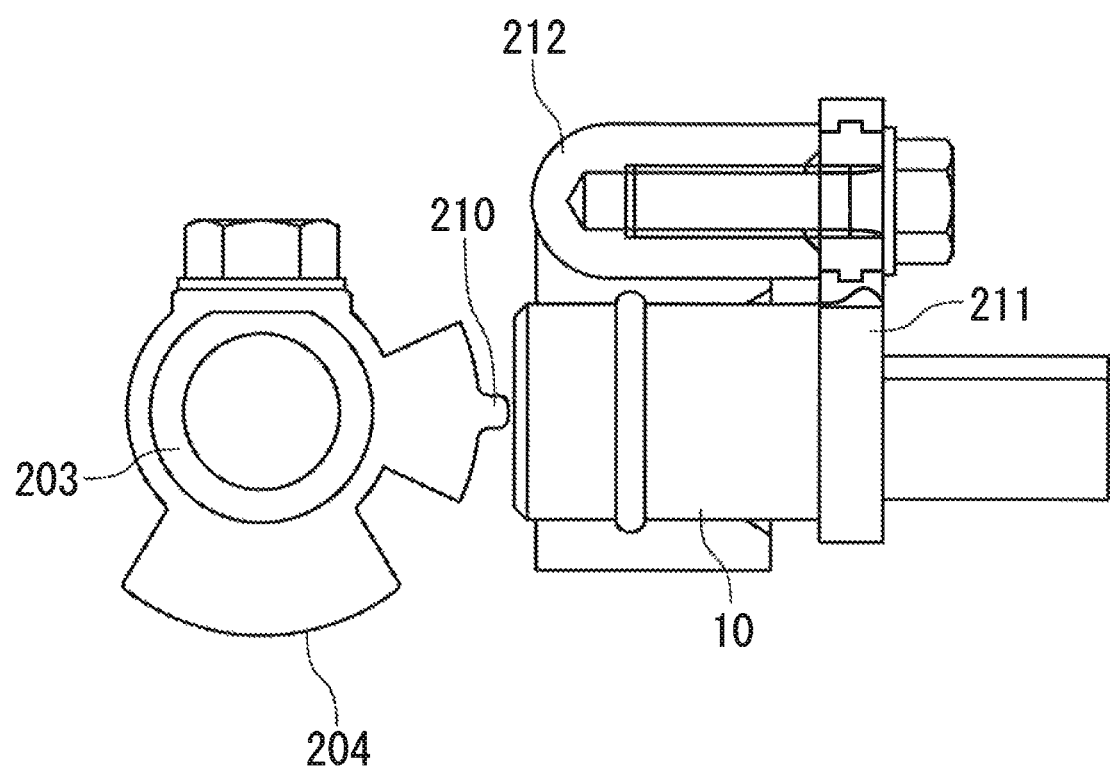
FIG. 3 is a view a detecting sensor with respect to the transmission.

FIGS. 1 to 3 show an exemplary embodiment of the detecting sensor 10 in a transmission 200. The transmission 200 includes a plurality of gears such as first to fifth or first to sixth gears. When a driver of an automobile operates a shift lever (not shown) in a longitudinal direction along a traveling direction of the automobile and in a traverse direction perpendicular to the longitudinal direction, a particular gear is selected. The rotation of an output shaft of an engine is transmitted to a drive shaft for driving a wheel via the selected gear. At this point, a rotation ratio (a speed reducing ratio, a speed increasing ratio) between the output shaft of the engine and the drive shaft is determined by a gear ratio of the selected gear.

Although only the conceptual configuration of the transmission 200 is described herein, one described in, for example, JP2002-235851A may be specifically employed as the transmission 200.

In the transmission 200, three plate-like shift members 202A to 202C are positioned to be stacked on each other to selectively connect a gear 201 constituting each stage to the output shaft of the engine and the drive shaft. Each of the shift members 202A to 202C can slide in a direction perpendicular to the stacking direction (a direction perpendicular to the paper face in FIG. 1). Gears 201 of different stages are selected when the shift member slides in one direction along its surface from a neutral position, and when the shift member slides in another direction from the neutral position.

The shift members 202A to 202C as described above are operated by a shift arm 204 portion of a shift selecting shaft 203.

The shift selecting shaft 203 is positioned having a longitudinal axis parallel to the stacking direction of the shift members 202A to 202C. The shift selecting shaft 203 is positioned to reciprocate in an axial direction along a through hole formed in a sleeve 205.

A selecting arm 206 for moving the shift selecting shaft 203 in the axial direction is positioned at an upper end portion of the shift selecting shaft 203. In the selecting arm 206, an intermediate portion 206b is rotatably supported on the sleeve 205, and a pin positioned at first end 206a is coupled to the upper end portion of the shift selecting shaft 203. A pin 206c positioned at the second end of the selecting arm 206 is coupled to an operation wire or an operation rod connected to the shift lever (not shown). In response to an operation in the traverse (select) direction of the shift lever, the selecting arm 206 rotates about the intermediate portion 206b, causing the shift selecting shaft 203 to reciprocate along the axial direction.

A shift rotor 207 is integrally positioned on an outer peripheral side of the shift selecting shaft 203. A pin 207a located on the outer peripheral side of the shift selecting shaft 203 is positioned on the shift rotor 207, and the pin 207a is coupled to an operation wire or an operation rod connected to the shift lever. (not shown) In response to an operation in the longitudinal (shift) direction of the shift lever, the shift rotor 207 rotates together with the shift selecting shaft 203 about the longitudinal axis.

A projecting member 208 extends from the outer peripheral side of the shift arm 204.

When the shift lever is operated in the traverse direction, the selecting arm 206 is actuated to perform a select operation, causing the projecting member 208 to move along the axial direction of the shift selecting shaft 203, which is the stacking direction of the shift members 202A to 202C. As the projecting member 208 moves along the axial direction, the projecting member 208 can face any one of the shift members 202A to 202C.

A projecting member receiving space 209, into which the projecting member 208 can be inserted, is formed in each of distal end portions of the shift members 202A to 202C. When the projecting member 208 moves in the stacking direction of the shift members 202A to 202C, the projecting member 208 is fitted into the projecting member receiving space 209 formed in any one of the shift members 202A to 202C.

When the shift lever is moved in the longitudinal direction and the projecting member 208 positioned in the projecting member receiving space 209 of any one of the shift members 202A to 202C, the shift rotor 207 is actuated to perform a shift operation. As the shift selecting shaft 203 rotates about the longitudinal axis, the projecting member 208 also rotates about the longitudinal axis. Since the projecting member 208 is positioned in the projecting member receiving space 209 of one of the shift members 202A to 202C, that shift member 202A to 202C also moves to one side or another side from the neutral position.

As shown in detail in FIG. 3, a detection projection 210 extends away from an outer peripheral portion of the shift arm 204. The detection projection 210 is positioned on a side of the shift arm 204 positioned opposite to the projecting member 208. In other embodiments, the detection projection 210 is positioned on an outer peripheral portion of the shift selecting shaft 203.

The detecting sensor 10 is positioned close to and facing the detection projection 210. The detecting sensor 10 is fixed to a housing 211 of the transmission 200 through a bracket 212. The detection projection 210 is positioned closest to the detecting sensor 10 in a neutral state in which the shift lever and the shift members 202A to 202C are at the neutral position. The detecting sensor 10 detects whether or not the detection projection 210 is at the close position, and thereby detects the rotation position of the shift arm 204.

Figure 4:
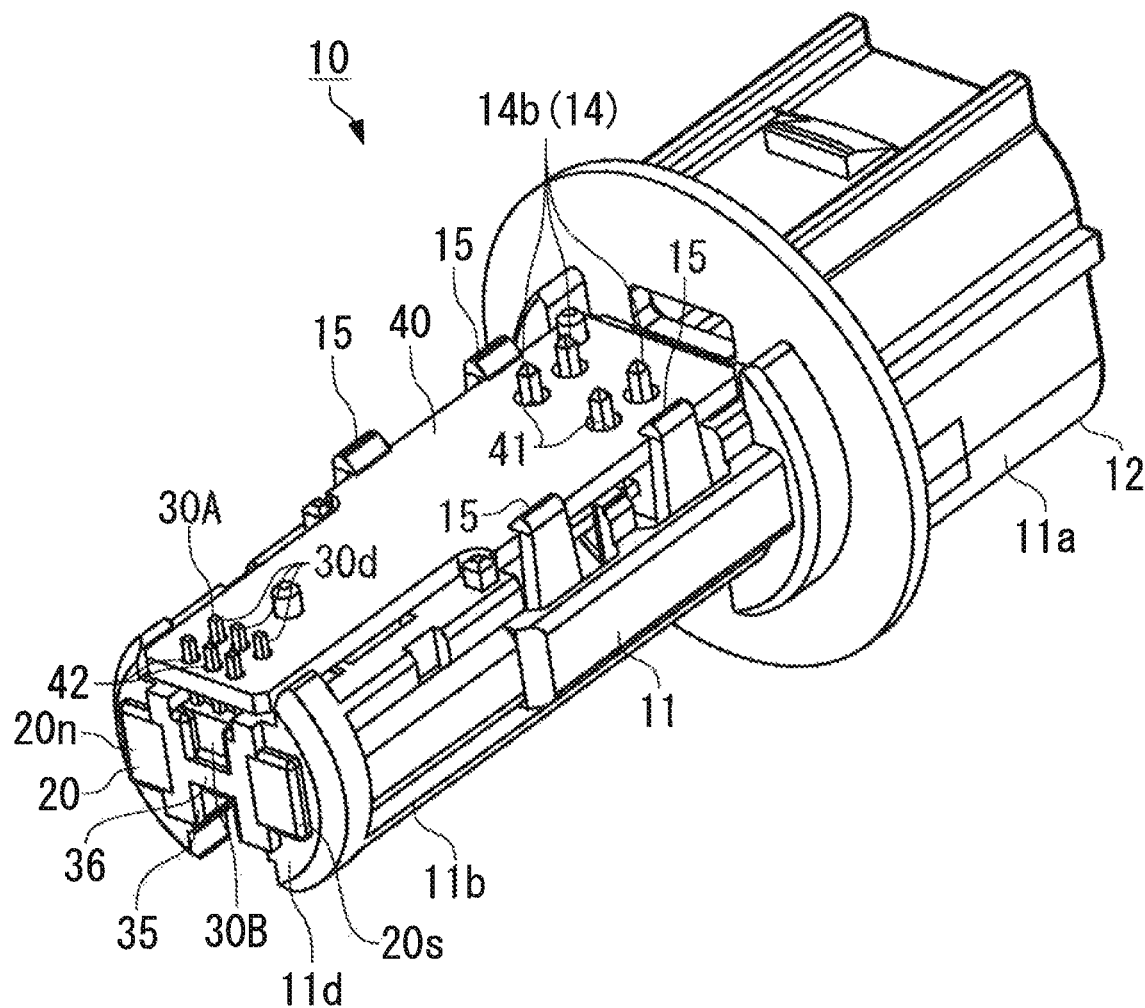
FIG. 4 is a perspective view an embodiment of the detecting sensor.
Figure 5:
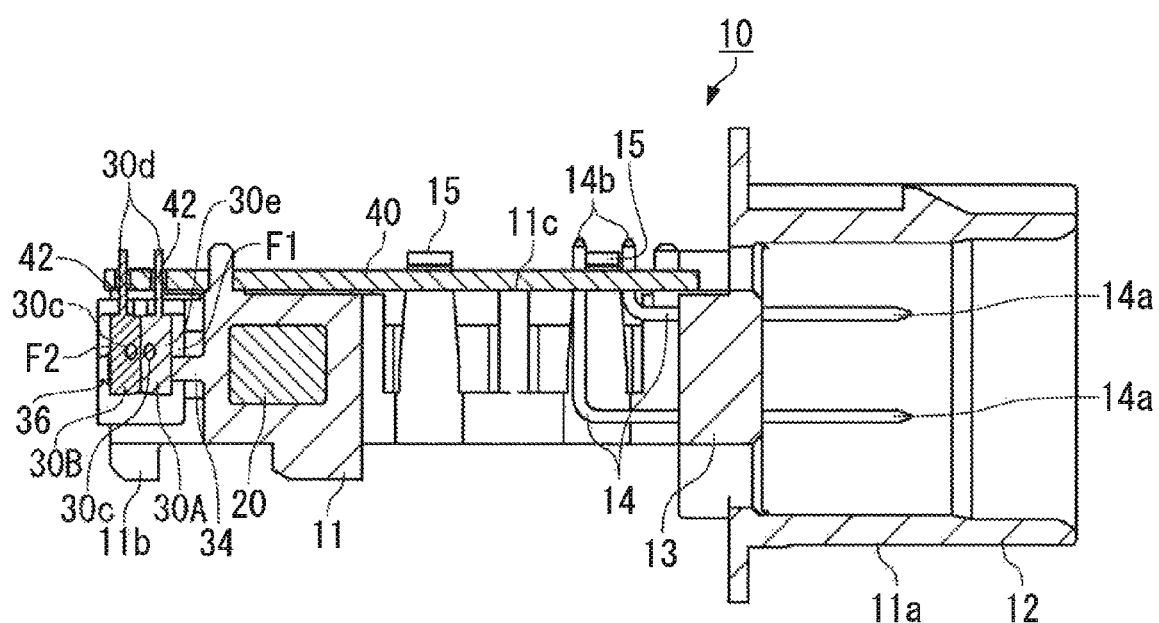
FIG. 5 is a sectional view of the detecting sensor along a longitudinal axis.
Figure 6A:
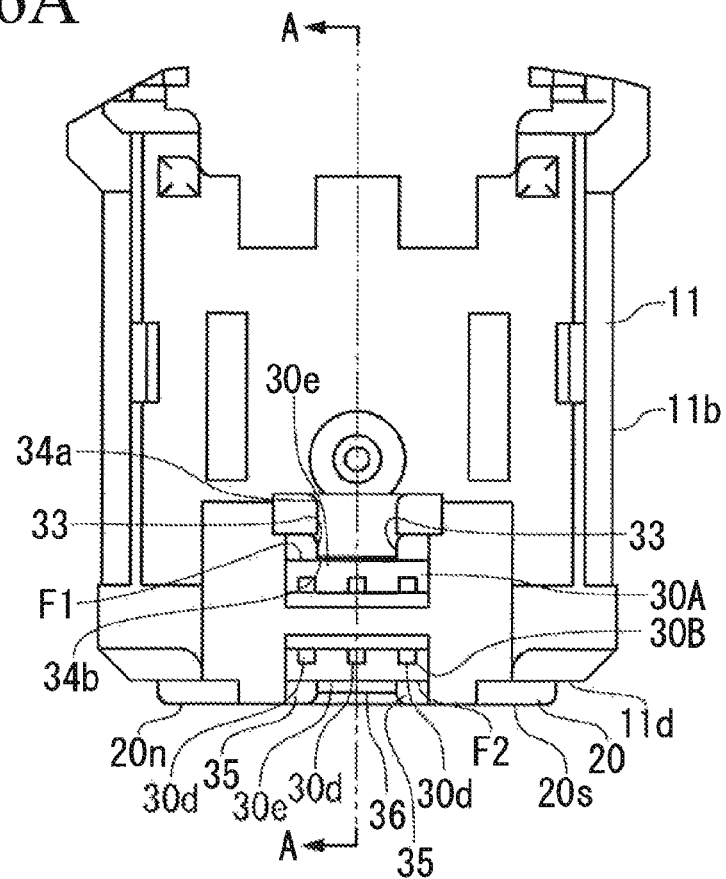
FIG. 6A is a plan view and FIG. 6B is a front view of a distal end portion of the detecting sensor.
Figure 6B:
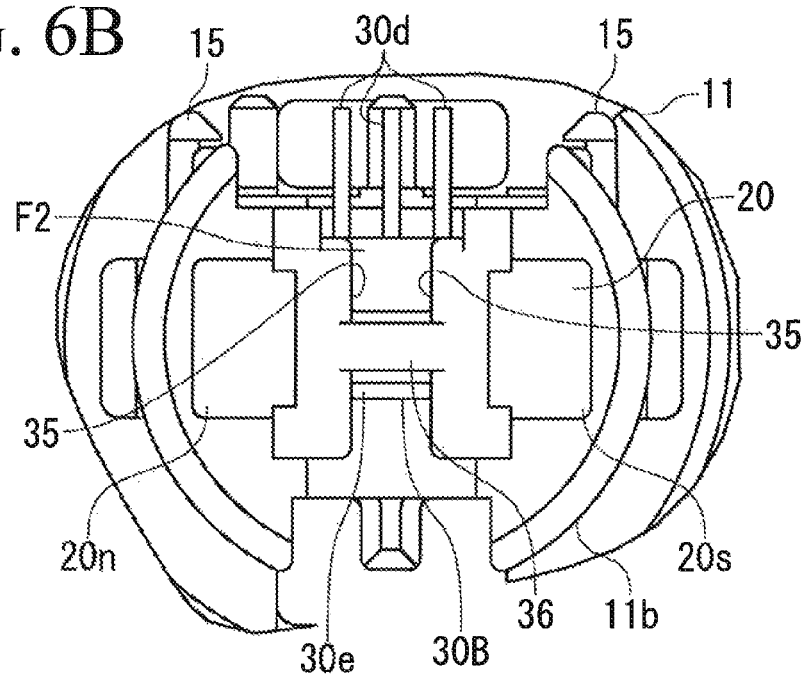
Figure 7A:
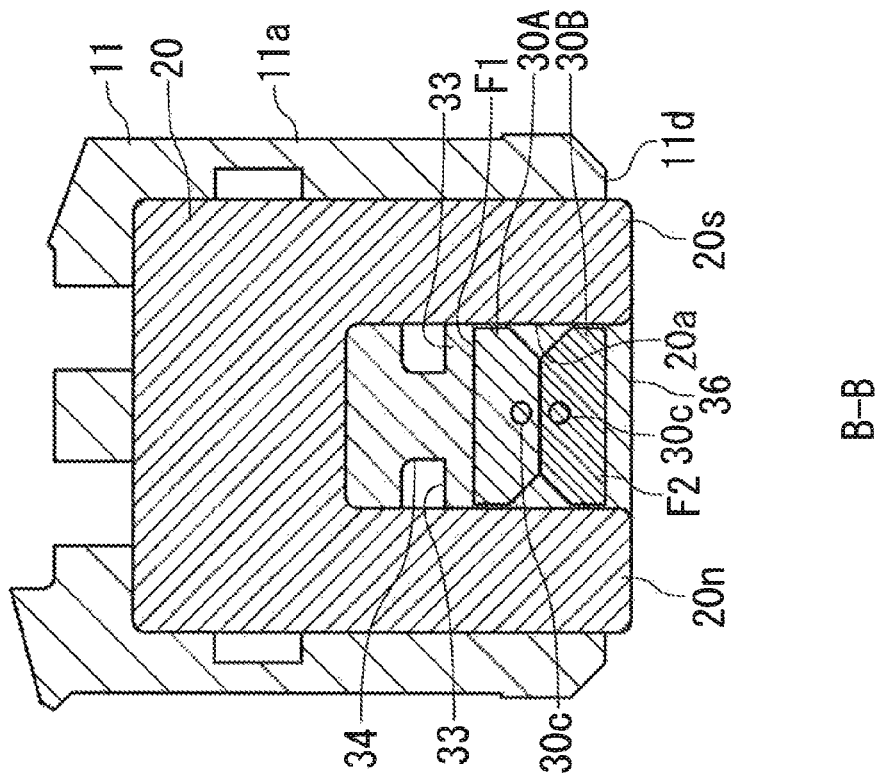
FIG. 7A is a sectional view of the detecting sensor along A-A in FIG. 6.
Figure 7B:
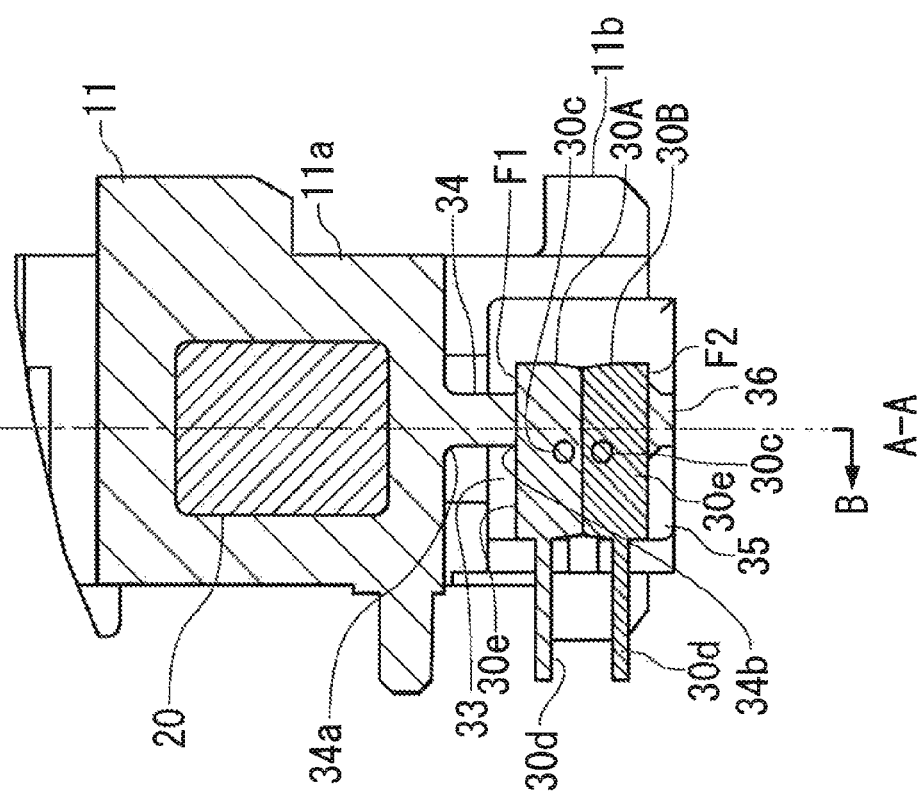
FIG. 7B is a sectional view of the detecting sensor along B-B in FIG. 7A.
Figure 8A:
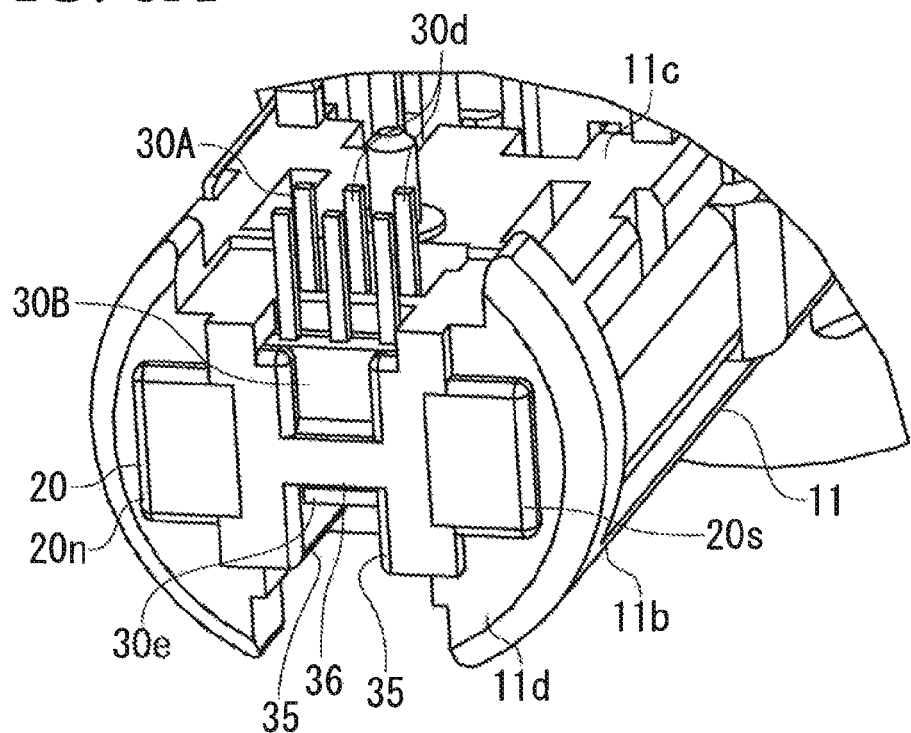
FIG. 8A is an enlarged perspective view of a distal end of the detecting sensor and FIG. 8B is an enlarged sectional view of the distal end portion of the detecting sensor.
Figure 8B:
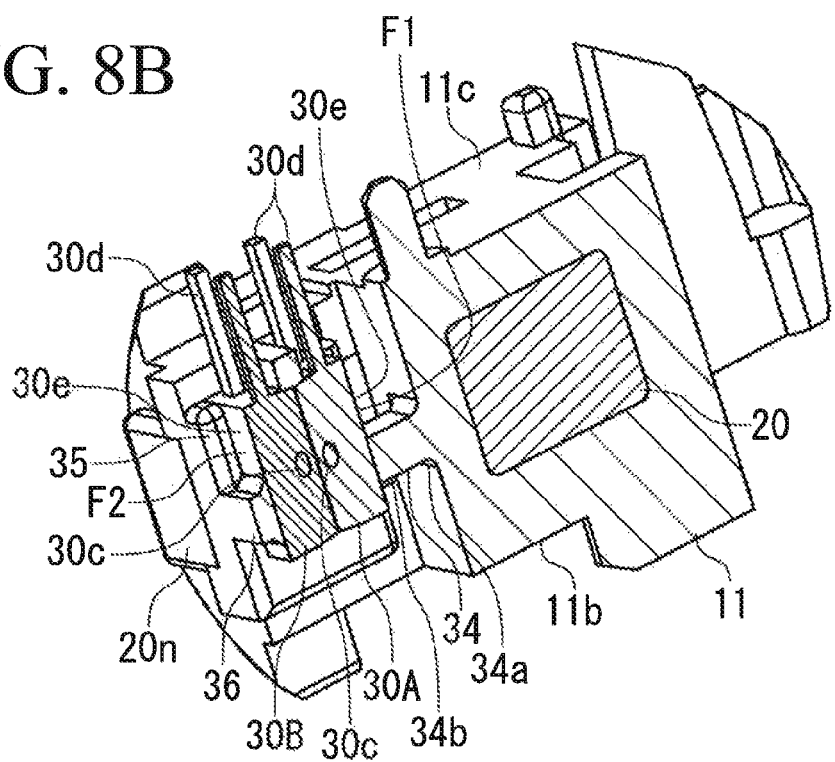

As shown in FIGS. 4 and 5, the detecting sensor 10 is a redundant system sensor including a housing 11, a magnet (a permanent magnet) 20 having a substantially U shape in member that is held in the housing 11, a pair of sensor elements 30A and 30B, and a substrate 40.

The housing 11 includes, at first end, a connector receiving member 11a to which a connector of a wire harness is connected, and, at the second end, a sensor holding member 11b that holds the magnet 20 and the sensor elements 30A and 30B.

The connector receiving member 11a includes a tubular sleeve 12 extending along a longitudinal axis, and a terminal holding member 13 positioned within the sleeve 12, perpendicular to the longitudinal axis of the sleeve 12.

A plurality of L-shaped terminals 14 made of a conductive material are held in the terminal holding member 13. In each of the terminals 14, a first end 14a is connected to a conductor constituting the wire harness inside the sleeve 12, and the second end 14b projects in a direction perpendicular to the longitudinal axis of the housing 11 from an intermediate portion of the housing 11.

A flat surface portion 11c is formed on a side surface of the housing 11. The substrate 40 has a rectangular shape extending along the longitudinal axis of the housing 11, and is positioned along the flat surface portion 11c. A plurality of substrate holding arms 15 contact and secure the substrate 40, and are positioned along the flat surface portion 11c. Each set of the substrate holding arms 15 is positioned so as to contact opposing sides of the substrate 40.

The second ends 14b of the terminals 14 are inserted into through holes 41 formed in the substrate 40, and electrically connected to a wiring pattern of the substrate 40.

As shown in FIGS. 6A,6B to 8A,8B, the sensor holding member 11b of the housing 11 holds the U-shaped magnet 20 such that both pole members 20n and 20s extend parallel along the longitudinal axis of the housing 11. Furthermore, the sensor holding member 11b holds the magnet 20 such that distal end portions of the both pole members 20n and 20s are exposed on a distal end surface 11d of the housing 11. Accordingly, the magnet 20 is buried in the housing 11 except for the distal end portions of the both pole members 20n and 20s.

The sensor elements 30A and 30B are positioned facing each other in a direction along the longitudinal axis of the housing 11 in a recess 20a. The recess 20a is positioned between the pole members 20n and 20s in the U-shaped magnet 20.

In an exemplary embodiment, the sensor elements 30A and 30B are hall elements, in each of which a hall element body 30C and first ends of terminals 30d are embedded in a body section 30e made of an insulating material.

The sensor elements 30A and 30B are positioned with the body 30e abutting against each other. The hall element bodies 30C of the sensor elements 30A and 30B are positioned adjacent to each other in the body 30e.

Positioning the hall element bodies 30C of the sensor elements 30A and 30B adjacent to each other serves to minimize the influence of a magnetic (magnetic field) strain.

The second ends of the terminals 30d are inserted into through holes 42 formed in the substrate 40, and electrically connected to the wiring pattern of the substrate 40. The sensor elements 30A and 30B are positioned such that the terminals 30d project in the same direction from the body 30e, perpendicular to the longitudinal axis of the housing 11.

The sensor elements 30A and 30B as described above are held in the housing 11 as described below.

The housing 11 includes a first sensor holding member 34 and a third sensor holding member 33 that hold the sensor elements 30A and 30B facing each other in the direction along an axis from the side of the sensor element 30A, and a second sensor holding member 36 and a fourth sensor holding member 35 that hold the sensor elements 30A and 30B from the side of the sensor element 30B.

The third and fourth sensor holding members 33 and 35 extend parallel to each other along two sides of the bodies 30e of the sensor elements 30A and 30B, and abut against both sides of surfaces F1 and F2 of the bodies 30e.

The first sensor holding member 34 has a columnar shape positioned substantially in a center portion of the body 30e of the sensor element 30A, and extending toward the body 30e from a perpendicular direction. A distal end portion 34b of the sensor holding member 34 abuts against the center portion of the surface F1 of the body 30e.

The second sensor holding member 36 extends along the body 30e in a direction perpendicular to the sensor holding members 35 located on the both sides of the body 30e of the sensor element 30B. The sensor holding member 36 abuts against the surface F2 of the body 30e of the sensor element 30B to form a substantially H shape together with the holding members 35 and 35 on the both sides.

Figure 9:
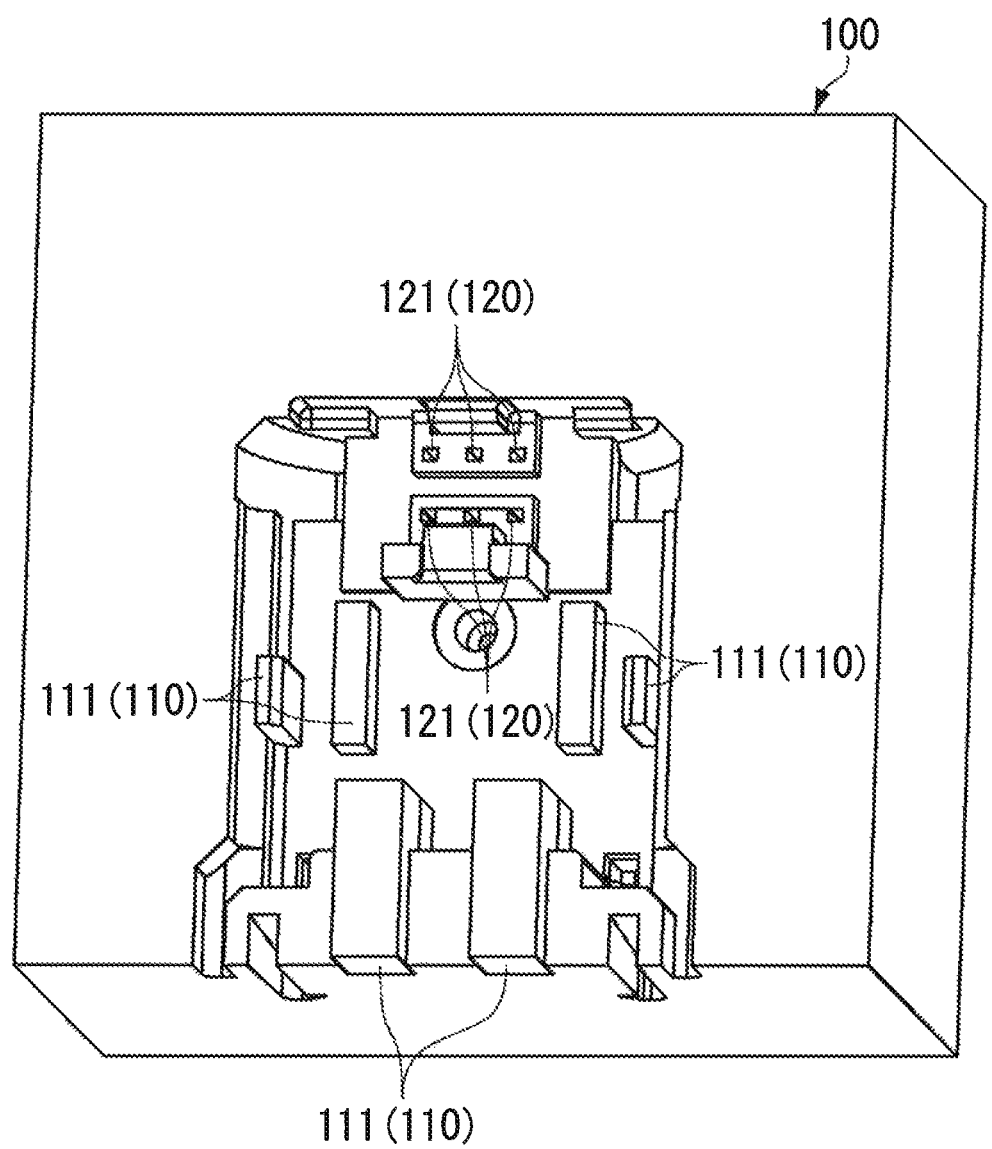
FIG. 9 is a perspective view of a housing mold having terminal receiving holes.

To manufacture the detecting sensor 10, a magnet holding member 110 for holding the magnet 20 and a sensor element holding member 120 for holding the sensor elements 30A and 30B are positioned in a mold 100 for forming the housing 11 by resin molding as shown in FIG. 9, and the housing 11 is formed using the mold 100.

Figure 10:
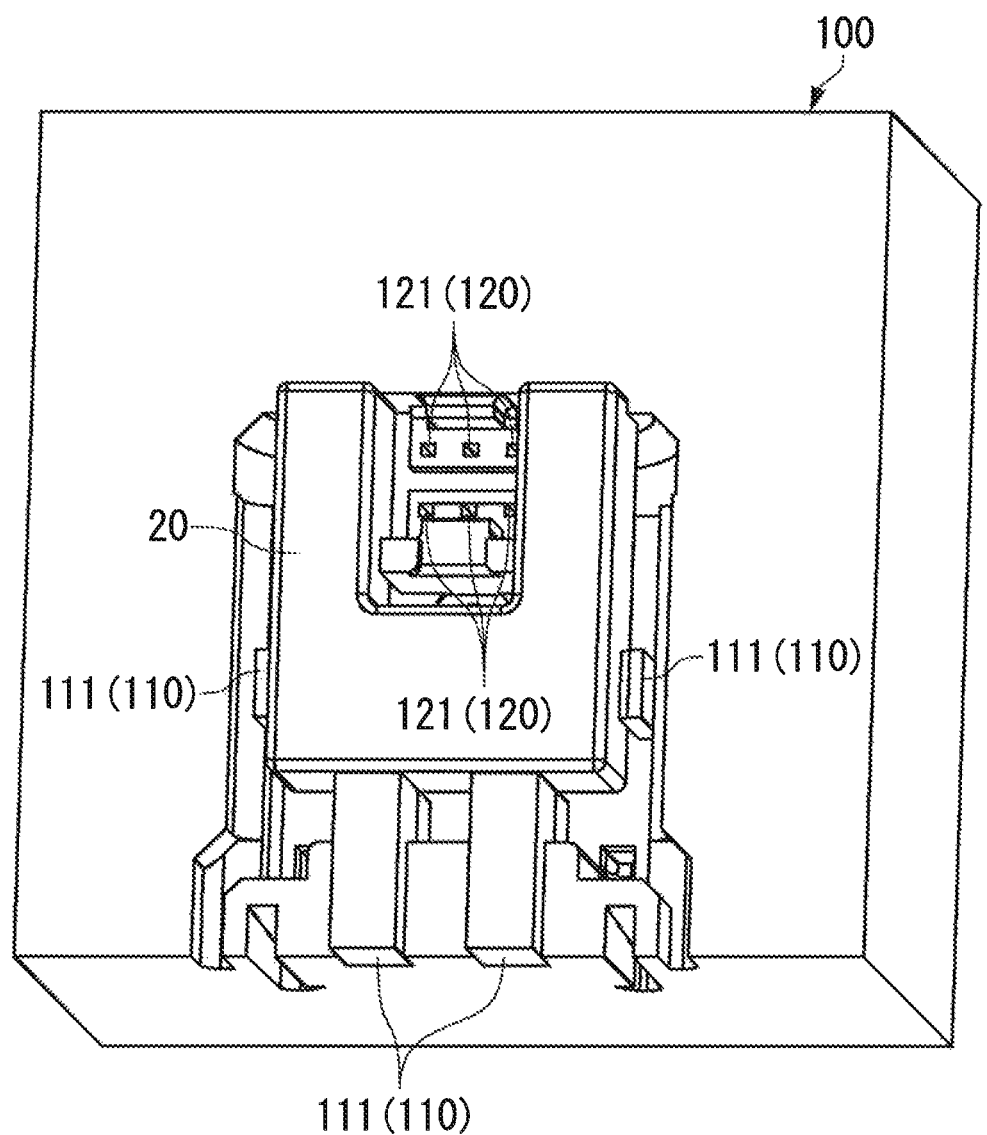
FIG. 10 is a perspective view of a magnet positioned in the mold shown in FIG. 9.

As shown in FIGS. 9 and 10, the magnet holding member 110 holds the magnet 20 by a plurality of holding projections 111.

Figure 11:
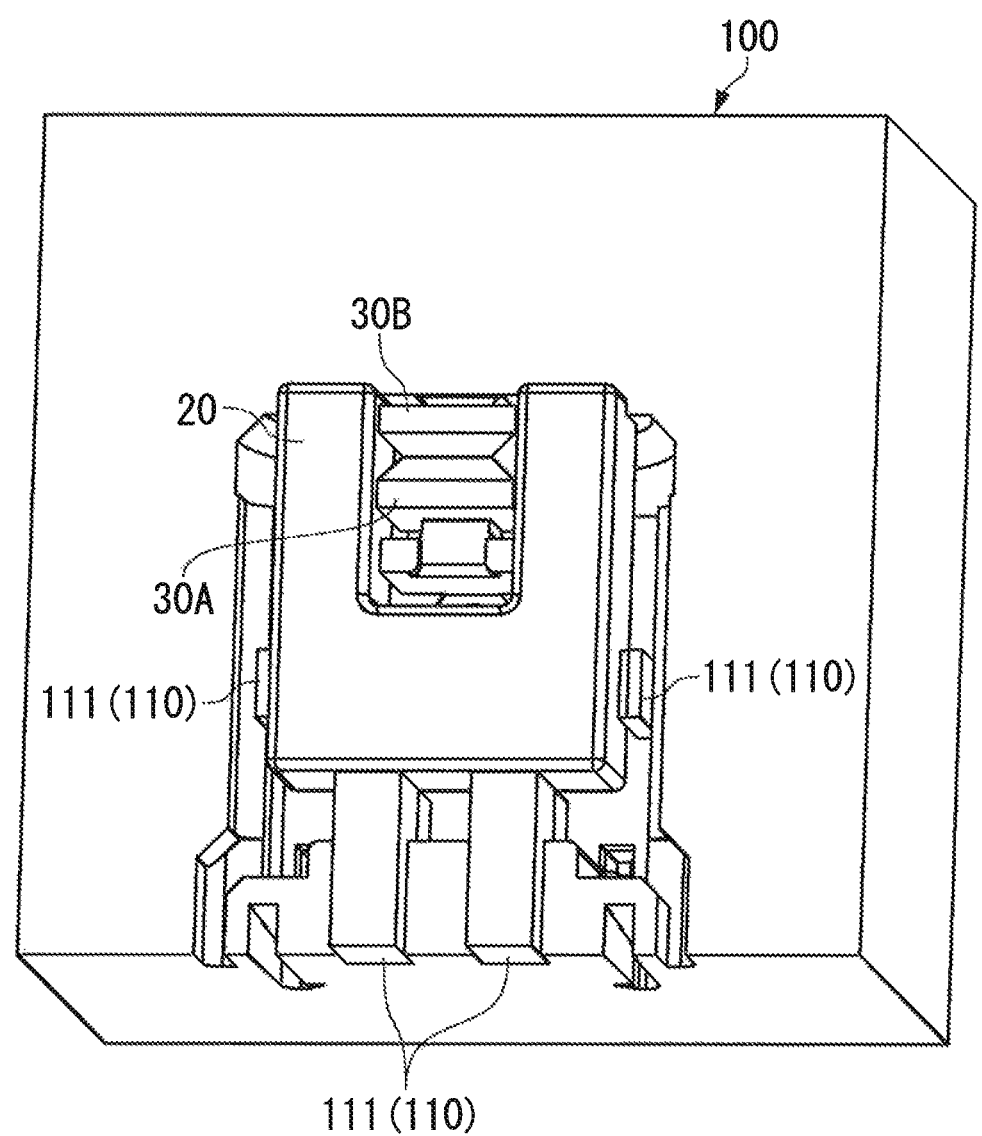
FIG. 11 is a perspective view of the magnet and the sensor elements positioned in the mold shown in FIG. 9.

As shown in FIGS. 9 and 11, the sensor element holding member 120 includes terminal receiving holes 121 into which the terminals 30d of the sensor elements 30A and 30B are respectively inserted. By inserting the terminals 30d into the terminal receiving holes 121, the sensor elements 30A and 30B are respectively held by the mold 100.

In a state in which the openable mold 100 is opened, the magnet 20 and the sensor elements 30A and 30B are held in the mold 100 by the magnet holding member 110 and the sensor element holding member 120. The mold 100 is closed in this state, and resin is injected into the mold 100.

At this point, particularly for the sensor holding member 34 extending in a columnar shape, the resin in a molten state flows from the side of a proximal end portion 34a to the side of the distal end portion 34b. Accordingly, the sensor elements 30A and 30B are biased against the holding members 35 and 36 on the opposite side.

The mold 100 is opened after curing of the resin, and the detecting sensor 10 is removed. The detecting sensor 10 is thereby obtained.

A bottomed tubular cover (not shown) is mounted to the detecting sensor 10 so as to cover the magnet 20, the sensor elements 30A and 30B, and the substrate 40.

In accordance with the aforementioned embodiments, in the detecting sensor 10, the sensor elements 30A and 30B are formed integrally with the housing 11, with the housing 11 being disposed over the magnet 20 and the sensor elements 40A and 30B. The sensor elements 30A and 30B are positioned and fixed by inserting the terminals 30d into the mold 100 used in molding, so that the sensor elements 30A and 30B can be positioned with respect to the housing 11 with high accuracy. Therefore, high detection accuracy can be maintained for the sensor elements 30A and 30B.

Moreover, this is achieved only by forming the terminal receiving holes 121 in the mold 100, so that high detection accuracy can be consistently be achieved at low cost.

Further, in the detecting sensor 10, the sensor elements 30A and 30B are held by the sensor holding members 33, 34, 35, and 36 in abutment against the surfaces F1 and F2 of the body 30e and 30e. Since the sensor elements 30A and 30B are sandwiched in a state facing each other by the sensor holding members 33, 34, 35, and 36, the sensor elements 30A and 30B held in a repeatable, consistent manner. Even further, since the sensor holding members 33, 34, 35, and 36 abut against only a portion, not the entire surface, of the surfaces F1 and F2 of the body 30e, heat dissipation properties of the sensor elements 30A and 30B can be ensured.

The detecting sensor 10 as described in the embodiments above, can detect whether or not the detection projection 210 formed on the rotating sleeve 205 is at a prescribed position (a neutral position) in a non-contact manner. The non-contact detecting sensor 10 exhibits excellent reliability since the detecting sensor 10 has no movable portion and thus has a fewer failures as compared to a contact switch.

Furthermore, in the detecting sensor 10, the body 30e and 30e of the sensor elements 30A and 30B abut against each other, so that the detecting sensor 10 can be reduced in size, easily positioned in the transmission 200, and mounted at low cost.

Also, while an object to be detected is the shift arm 204 rotating together with the shift selecting shaft 203, the influence of a magnetic (magnetic field) strain can be minimized since the hall element bodies 30C and 30C of the sensor elements 30A and 30B are positioned adjacent to each other in a plurality of adjacent, overlapping bodies 30e and 30e. The detection accuracy of the detecting sensor 10 can be thereby improved.

Although the detecting sensor 10 has been described in the above embodiments for detecting whether or not the shifting of the manual transmission of the automobile is in the neutral state, those of ordinary skill in the art would understand that the detecting sensor 10 may be used in other applications. For example, the detecting sensor 10 may be used for detecting whether or not an automatic transmission is in a parking state, as described below based on FIGS. 12 and 13.

Figure 12:
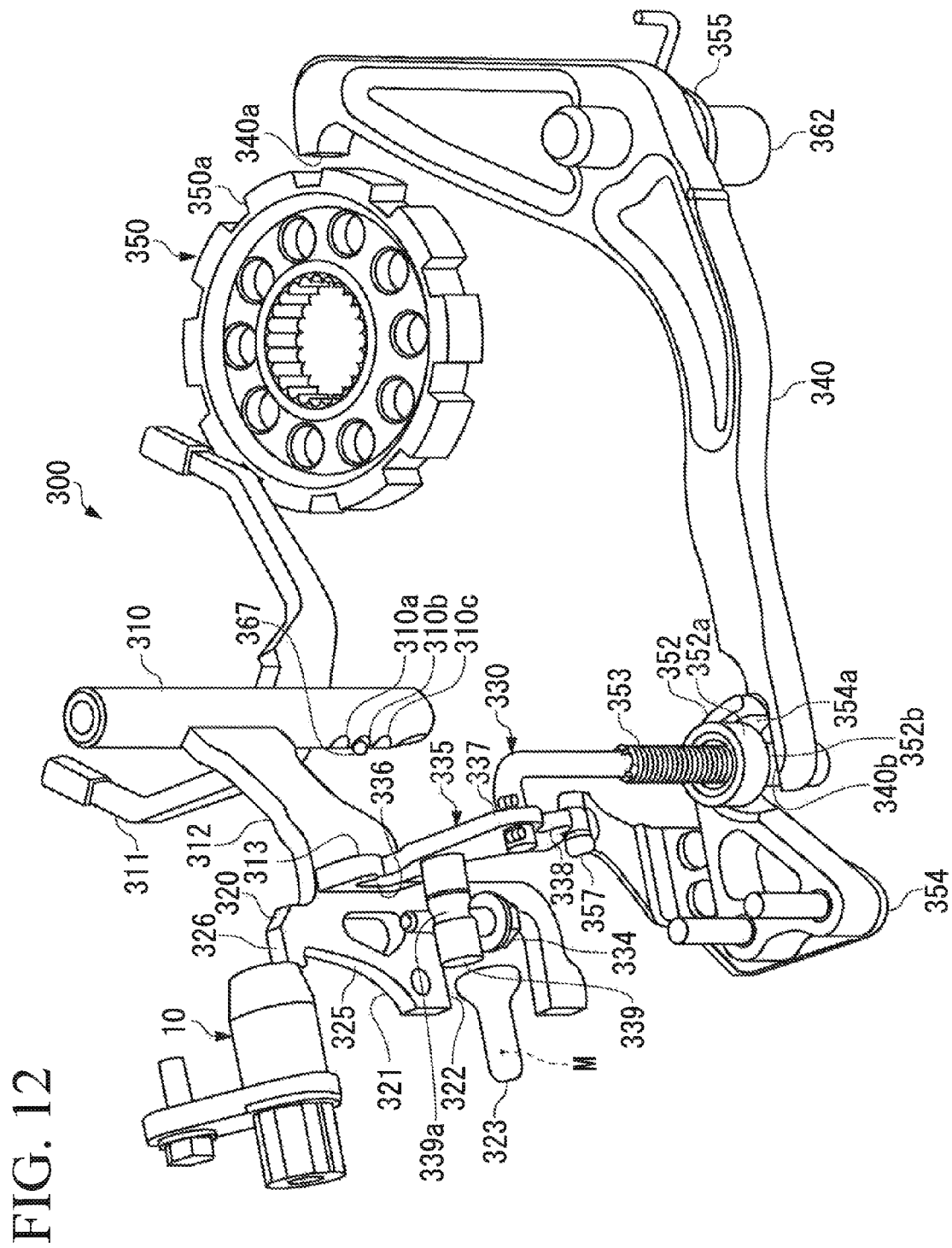
FIG. 12 is a perspective view of a parking lock device in a parking released state.

First, a parking lock device 300 of an exemplary automatic transmission is described by reference to FIG. 12. The parking lock device 300 is applied to a transmission that can establish a predetermined gear speed by operating a meshing clutch positioned on a gear shift shaft by a shift rod 310 connected to and actuated by an actuator M. FIG. 12 shows the parking lock device 300 in a neutral state.

The parking lock device 300 includes a parking gear 350 that is positioned on a reverse idle shaft moving in conjunction with the drive shaft when the vehicle is stopped, a parking pawl 340 that can be engaged with the parking gear 350, and a parking rod 330 that moves in conjunction with the shift rod 310 to actuate the parking pawl 340. The parking lock device 300 can bring the parking gear 350 into a lock state by transmitting the operation of a shift member 320 formed integrally with the shift rod 310 to the parking pawl 340 via the parking rod 330.

In the parking lock device 300, the shift rod 310 can axially rotate and selectively stop at three positions: a neutral position, a reverse position, and a parking position, in a clicked manner. The shift rod 310 is detected to be in a parking state or not when the shift member 320 integrated therewith axially moves by the actuator M, and the detecting sensor 10 detects the position.

To this end, three detent grooves 310a, 310b, and 310c are formed in the shift rod 310, so that the shift rod 310 is at the neutral position when a detent ball 367, urged by an spring (not shown), engages with the detent groove 310b, and at the parking position when the detent ball 367 engages with the detent groove 310c. Therefore, when the shift rod 310 is axially rotated from the neutral state to the parking state, the shift rod 310 moves upwardly in the drawing.

A shift fork 311 and a coupling beam 312 are formed integrally with the shift rod 310. The coupling beam 312 integrally couples the shift rod 310 to the shift member 320. A locking claw 313 is also formed integrally with the coupling beam 312.

The shift member 320 includes a cam member 321 and a detection arm 325.

A cam groove 322 that penetrates through the cam member 321 and opens at first end is formed in the cam member 321, and first end side of a cam plate 323 is inserted into the cam groove 322 through the opening. In the cam plate 323 where first end side is set to a large width, the actuator M is connected to the second end side, and when the actuator M forwardly and reversely rotates the cam plate 323, the shift rod 310 moves up and down. For example, when the actuator M is forwardly rotated counterclockwise, the cam plate 323 presses the cam member 321 upwardly in the drawing, and the shift rod 310 moves up. In the following, up, down, left, and right indicate directions in the drawings.

The detection arm 325 is formed integrally with an upper portion of the cam member 321, and raised and lowered in association with the up-and-down movement of the cam member 321. A detection projection 326 is formed at a distal end of the detection arm 325, and the detecting sensor 10 is positioned facing and in close proximity to the detection projection 326. A relative positional relationship between the detecting sensor 10 and the detection projection 326 is changed between the neutral state and the parking state, so that the detecting sensor 10 can detect whether or not the state is in the parking state, by the detecting sensor's 10 proximity to the detection projection 326.

The parking rod 330 transmits the up-and-down movement of the shift member 320 (the shift rod 310) to the parking pawl 340. The parking rod 330 is coupled to the locking claw 313 of the coupling beam 312 through a swing arm 335. The swing arm 335 includes a locking claw 336 that is engaged with the locking claw 313 on first end. The swing arm 335 also includes a rod receiving hole 337 on a second end, where a distal end bent in an L shape of the parking rod 330 is held by passing through the rod receiving hole 337. The swing arm 335 further includes a locking projection 338 positioned below the rod receiving hole 337 and engaged with a locking spring member 357. A positioning rod 339 is positioned on one side surface of the swing arm 335, and the swing arm 335 performs swinging motion about the axis of the positioning rod 339. Therefore, when the shift member 320 is moved up by the actuator M, the swing arm 335 rotates clockwise in conjunction with the shift member's 320 motion, and the parking rod 330 moves down along an axis substantially parallel to the longitudinal axis of the shift rod 310. Conversely, when the shift member 320 moves down, the swing arm 335 swings counterclockwise, and the parking rod 330 moves up.

An arc-shaped groove 339a continuous in a circumferential direction is formed in the outer periphery of the positioning rod 339, and a columnar support pin 334 is positioned into the groove 339a. The support pin 334 regulates movement of the swing arm 335 in an axial direction of the positioning rod 339 while allowing the rotational movement of the swing arm 335.

A cam member 352 is slidably fitted to the parking rod 330. The cam member 352 includes an equal-diameter member 352a and a tapered member 352b whose diameter is gradually decreased from a lower end of the equal-diameter member 352a. The cam member 352 applies a downward force through a compressed coil spring 353 positioned around the parking rod 330. When the parking rod 330 moves down in the parking state, the cam member 352 applies a great downward force than the parking rod 330.

A cam receiving member 340b of the parking pawl 340 and a cam receiving member 354a of a parking rod holder 354 are positioned near the cam member 352. The cam receiving member 340b and the cam receiving member 354a include tapered surfaces corresponding to the tapered member 352b on their surfaces. Since the parking rod 330 is positioned relatively high when in the neutral state shown in FIG. 12, the cam member 352 is pressed against the cam receiving member 340b and the cam receiving member 354a by a relatively weak force. The position of the parking rod holder 354 is fixed.

The parking pawl 340 locks and unlocks the parking gear 350 in conjunction with the operation of the parking rod 330.

The L-shaped parking pawl 340 is swingably supported in a bend portion by a support shaft 362 whose position is fixed. The parking pawl 340 includes an engagement claw 340a, formed on a first end of the parking pawl 340, engageable with a engagement claw receiving groove 350a formed in the outer periphery of the parking gear 350, and the cam receiving member 340b formed on a second end of the parking pawl 340.

The engagement claw 340a moves away from the parking gear 350 through a force applied to the parking pawl 350 by a torsional spring 355 positioned on the outer periphery of the support shaft 362. In the neutral state, when the engagement claw 340a is positioned away from the engagement claw receiving groove 350a, a distance between the cam receiving member 340b and the cam receiving member 354a of the parking rod holder 354 is reduced. In the parking state, the parking rod 330 moves down, causing the cam member 352 to also be pressed down, such that the cam member 352 is pushed into a space between the cam receiving member 340b and the cam receiving member 354a. Since the position of the cam receiving member 354a is fixed, the parking pawl 340 rotates counterclockwise when a force that the cam receiving member 340b receives from the tapered member 352b becomes larger than a force that the parking pawl 340 receives from the torsional spring 355.

The parking gear 350 is fixed to the reverse idle shaft (not shown) moving in conjunction with the drive shaft when the vehicle is stopped, and the parking state is ensured by locking the parking gear 350.

The parking gear 350 is positioned corresponding to the engagement claw 340a of the parking pawl 340, and when the parking pawl 340 rotates counterclockwise as described above, the engagement claw 340a is inserted into the engagement claw receiving groove 350a to lock the parking gear 350.

Figure 13:
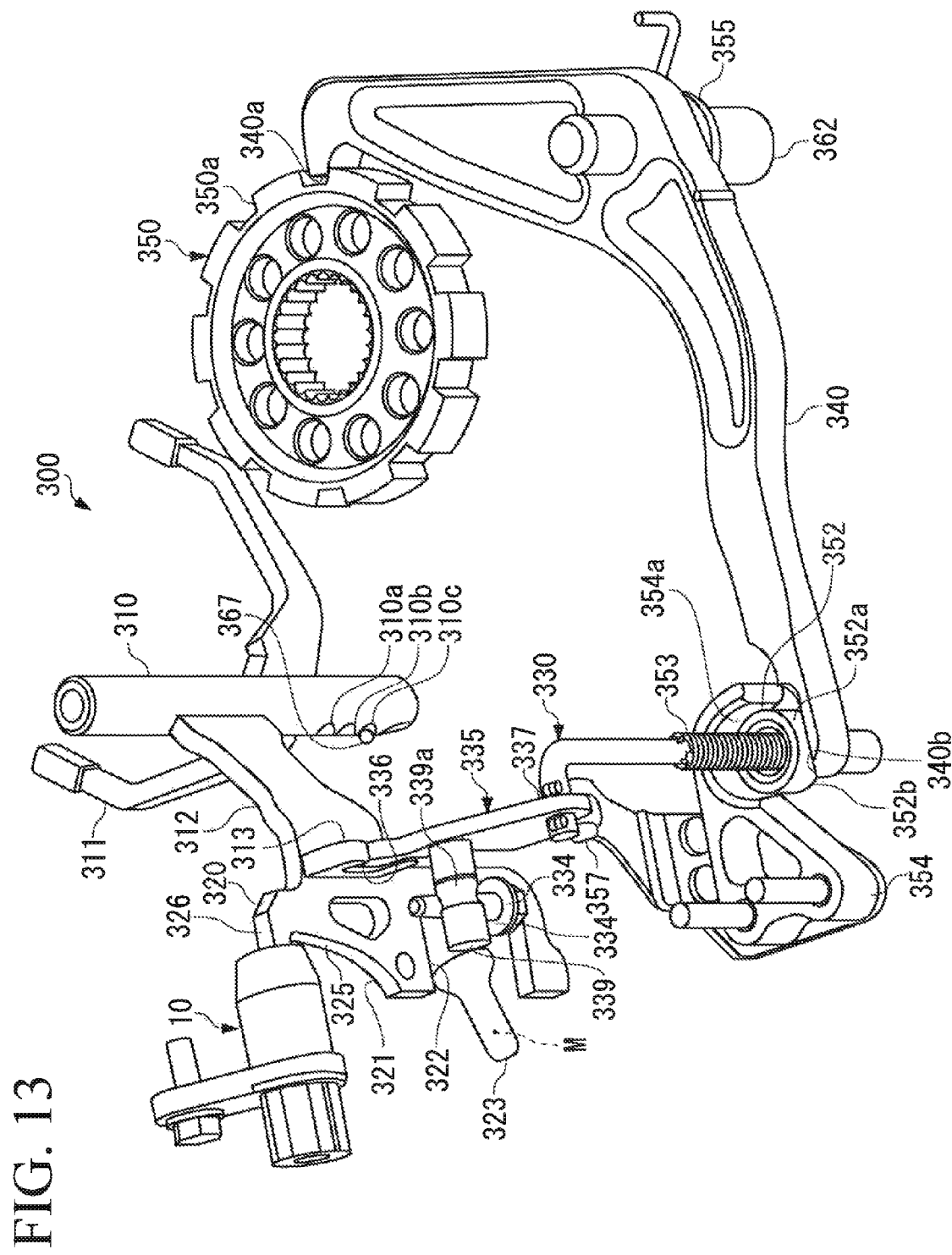
FIG. 13 is a perspective view of the parking lock device in FIG. 12 in a parking active state.
Figure 14:
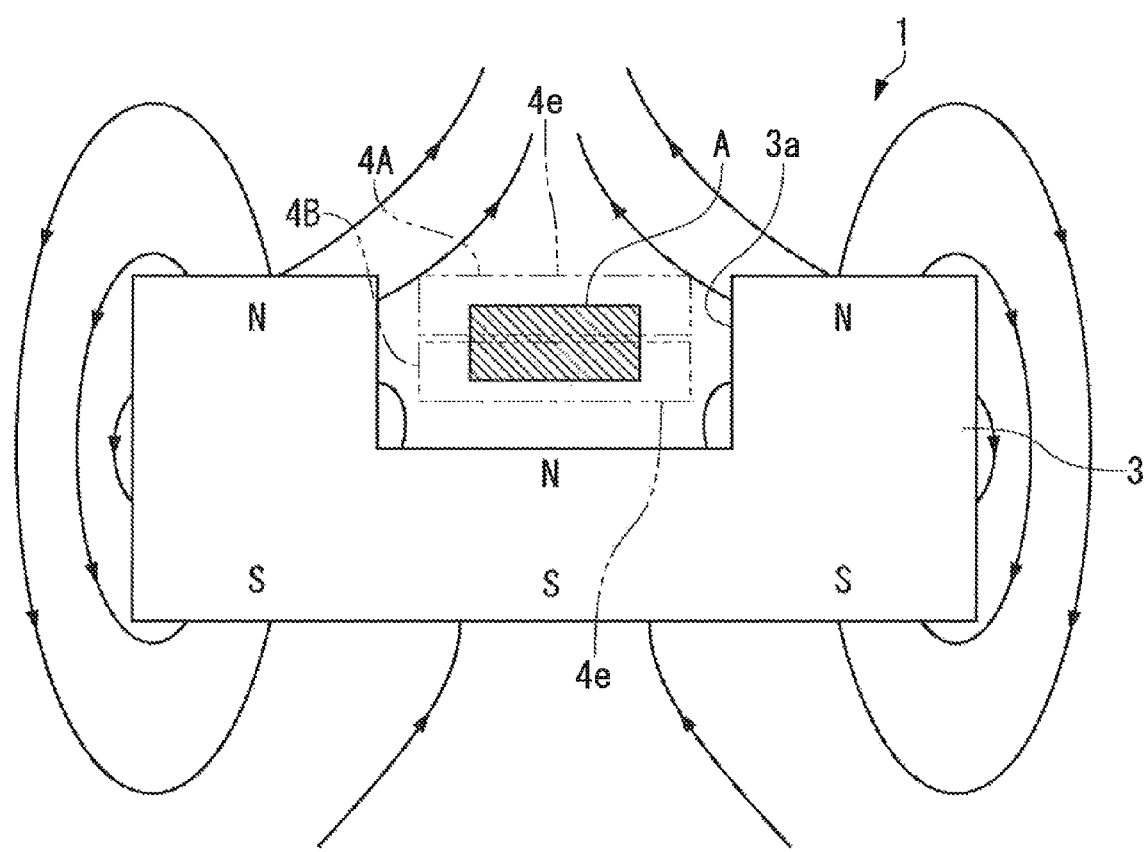
FIG. 14 is a perspective view of the positions of sensor elements in a magnetic field generated by a magnet in a conventional detecting sensor.

Next, the operation of a process in which the parking lock device 300 is shifted from the neutral state to the parking state is described by reference to FIG. 13.

When the shifting is changed from the neutral state to the parking state, the actuator M rotates the cam plate 323 counterclockwise. Accordingly, the shift member 320 moves up, and the parking pawl 340 follows the operation of the swing arm 335 and the parking rod 330 to rotate counterclockwise from a position in FIG. 12 to a position in FIG. 13. As a result, the parking gear 350 is locked.

In this state, the cam member 352 is positioned between the cam receiving member 340b and the cam receiving member 354a. When the parking rod 330 moves down to the parking state, the locking projection 338 is displaced downward across a distal end of the locking spring member 357, so that the parking rod 330 is prevented from moving up by mistake. Therefore, the parking lock state is stably maintained.

When the shift member 320 moves up, the detection projection 326 also follows the movement, and is displaced upward across the distal end of the locking spring member 357. The proximity of the detection projection 326 to the detecting sensor 10 differs between the neutral state and the parking state. Therefore, when the detection projection 326 is in close proximity to the detecting sensor 10, the detecting sensor 10 detects the displacement of the detection projection 326 to determine whether or not the state is in the parking state.

The mounting position of the detecting sensor 10 is not limited to the aforementioned position, and may be installed close to another member whose position moves in conjunction with the shift rod 310. For example, the detecting sensor 10 may be installed in close proximity to an upper end of the shift rod 310, or close to an upper end of the parking rod 330.

Although the present invention has been described using embodiments where the detecting sensor 10 is used in an automobile for detecting the position of a part as an example, the present invention is not limited to the application.

Although the magnet 20 has been described in the above embodiments as having a substantially U shape member, the magnet 20 is not limited to the U-shape, but may also have another appropriate shape.

Further, as long as the same effects as those described in the above embodiments are obtained, the arrangement, the installed number, and/or the shape of the sensor holding members 33, 34, 35, and 36 may have a configuration other than those described above.

sensor elements that detect a change in the magnetic field generated by the magnet;

In addition to the advantages described above, further advantages include enhanced heat dissipation properties of the sensor elements 30A,30B, since the sensor holding members 34,36 contact only a portion of the body 30e of the sensor elements 30A,30B Another advantage is that the detecting sensor 10 is reduced in size, easily positioned, and mounted at low cost without requiring modifications to the object being detected. Such advantages are realized because the bodies 30e are positioned overlapping, with the surfaces of the bodies 30e abutting against the adjacent bodies 30e.

Another advantage is that by arranging the sensor elements 30A,30B adjacent to each other, the influence of the magnetic (magnetic field) strain can be minimized, and the detection accuracy can be improved. Also, by decreasing a gap between the sensor elements 30A,30B, the detecting sensor 10 can be reduced in size, positioned with a higher degree of freedom, and easily mounted.

Yet another advantage is that the above embodiments of the detecting sensor 10 stably exhibits high detection accuracy at low cost.

Another advantage is that during the manufacturing process, each of the sensor elements 30A,30B are fixed to the mold 100 by inserting the terminals of the sensor elements 30A,30B into the terminal receiving holes in the mold 100, so that the sensor elements 30A,30B can be positioned with respect to the mold 100 with high accuracy. By injecting the molten resin into the mold 100 in this state to form the housing 11, the detecting sensor 10 can be formed while the sensor elements 30A,30B are positioned with respect to the magnet 20 with high accuracy. Such an advantage is achieved by forming the terminal receiving holes 121 in the mold 100, so that the above effects can be obtained at low cost.

The embodiments described above may be also freely selected or changed into other constitutions without departing from the scope of the present invention.

What is claimed is:

1. A detecting sensor comprising:
   a magnet;
   a plurality of magnetic field detecting sensor elements having a plurality of adjacent, overlapped bodies and a plurality of terminals projecting from the bodies in a same direction;
   a housing disposed over the magnet and the plurality of sensor elements, and having a first sensor holding member positioned on a first side of the housing and abutted against only a portion of a surface of the body on a first side of the plurality of sensor elements; and a second sensor holding member positioned on a second side of the housing and abutted across only a portion of a surface of the body of the sensor element on a second side of the plurality of sensor elements.

* * * * *